US010600457B2

United States Patent
Kim et al.

(10) Patent No.: US 10,600,457 B2
(45) Date of Patent: Mar. 24, 2020

(54) SAMPLING CIRCUIT AND SEMICONDUCTOR MEMORY DEVICE USING A SAMPLING CIRCUIT

(71) Applicant: SK hynix Inc., Icheon-si, Gyeonggi-do (KR)

(72) Inventors: Bo Ram Kim, Yongin-si (KR); Dae Han Kwon, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/189,443

(22) Filed: Nov. 13, 2018

(65) Prior Publication Data
US 2019/0318772 A1 Oct. 17, 2019

(30) Foreign Application Priority Data
Apr. 16, 2018 (KR) .................. 10-2018-0043929

(51) Int. Cl.
| | | |
|---|---|---|
| *G06F 1/12* | (2006.01) | |
| *G11C 7/22* | (2006.01) | |
| *G11C 7/10* | (2006.01) | |
| *G11C 11/40* | (2006.01) | |

(52) U.S. Cl.
CPC .............. *G11C 7/22* (2013.01); *G11C 7/1057* (2013.01); *G11C 7/1066* (2013.01); *G11C 11/40* (2013.01)

(58) Field of Classification Search
CPC ....... G11C 7/22; G11C 7/1057; G11C 7/1066; G11C 11/40
USPC .......................................................... 365/174
See application file for complete search history.

(56) References Cited

U.S. PATENT DOCUMENTS 6,446,158 B1 * 9/2002 Karabatsos ......... G06F 13/4243
365/194
7,577,861 B2 8/2009 Levin et al.

FOREIGN PATENT DOCUMENTS

KR 1020090115008 A 11/2009

OTHER PUBLICATIONS

Seung-Jun Bae et al., "A 40nm 7Gb/s/pin Single-ended Transceiver with Jitter and ISI Reduction Techniques for High-Speed DRAM Interface", Symposium on VLSI Circuits/Technical Digest of Technical Papers, 2010, pp. 193-194, IEEE, Samsung Electronics, Hwasung, Korea.

* cited by examiner

*Primary Examiner* — Xiaochun L Chen
(74) *Attorney, Agent, or Firm* — William Park & Associates Ltd.

(57) ABSTRACT

A sampling circuit may include a first timing determination circuit, a second timing determination circuit, and a sampling data output circuit. The first timing determination circuit may determine a first timing of sampling data in response to a first sampling timing signal. The second timing determination circuit may determine a second timing of the sampling data in response to a second sampling timing signal. The sampling data output circuit may output the sampling data having effective data values of the data between the first timing and the second timing in response to outputs from the first and second timing determination circuits.

14 Claims, 3 Drawing Sheets

SAMPLING CIRCUIT AND SEMICONDUCTOR MEMORY DEVICE USING A SAMPLING CIRCUIT

CROSS-REFERENCES TO RELATED APPLICATION

The present application claims priority under 35 U.S.C. § 119(a) to Korean application number 10-2018-0043929, filed on Apr. 16, 2018, in the Korean Intellectual Property Office, which is incorporated herein by reference in its entirety.

BACKGROUND

1. Technical Field

Various embodiments may generally relate to a semiconductor integrated circuit, and more particularly, to a sampling circuit and a semiconductor memory device using the sampling circuit.

2. Related Art

A semiconductor memory device may receive and store data. The semiconductor memory device may output the stored data.

As an operation speed of the semiconductor memory device increases, a transmission speed of data between the semiconductor memory device and an external device, such as a controller, may also increase.

In order to increase the transmission speed of the data, the semiconductor memory device may transmit/receive the data to/from the controller based on a synchronization signal. The synchronization signal may include a dock signal, a data strobe signal, etc.

SUMMARY

In accordance with the present disclosure, a sampling circuit may include a first timing determination circuit, a second timing determination circuit, and a sampling data output circuit. The first timing determination circuit may determine a first timing of sampling data in response to a first sampling timing signal. The second timing determination circuit may determine a second timing of the sampling data in response to a second sampling timing signal. The sampling data output circuit may output the sampling data having effective data values of the data between the first timing and the second timing in response to outputs from the first and second timing determination circuits.

Also in accordance with the present disclosure, a sampling circuit may output data as sampling data during an interval between a rising time of a first sampling timing signal and a rising timing of a second sampling timing signal.

Further in accordance with the present disclosure, a semiconductor memory device may include a plurality of sampling circuits and a data arrangement circuit. The sampling circuits may output memory output data as sampling data in response to each of rising timings of at least two sampling timing signals. The data arrangement circuit may arrange the sampling data and output arrangement data.

BRIEF DESCRIPTION OF THE DRAWINGS

The above and other aspects, features, and advantages of the subject matter of the present disclosure are more dearly understood from the following detailed description taken in conjunction with the accompanying drawings.

DETAILED DESCRIPTION

Various embodiments of the present teachings are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments. However, embodiments of the present teachings should not be construed as being limiting. Although a limited number of possible embodiments of the present teachings are shown and described, it will be appreciated by those of ordinary skill in the art that changes may be made to these embodiments without departing from the principles and spirit of the present teachings.

Figure 1:
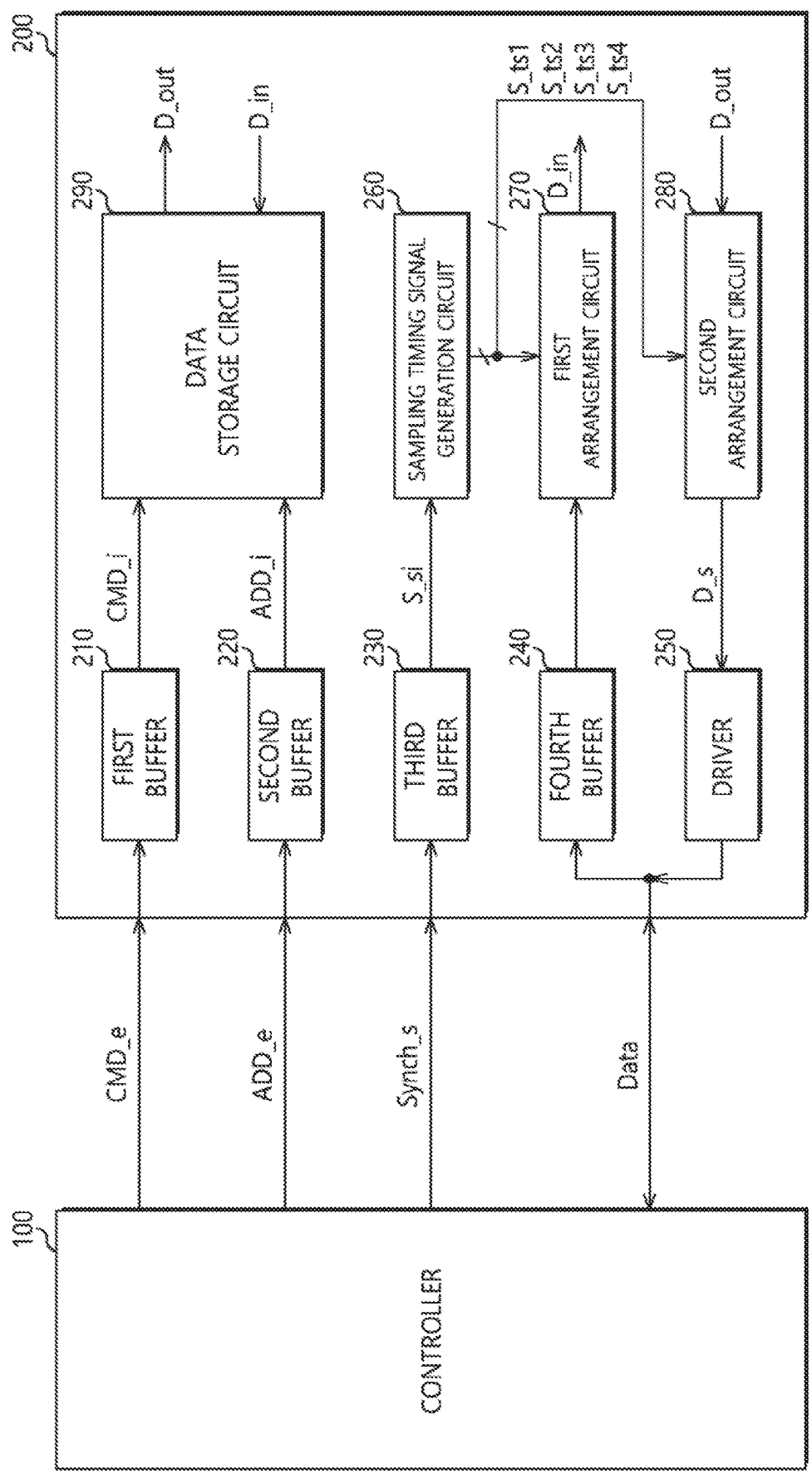
FIG. 1 illustrates a system including a semiconductor memory device in accordance with example embodiments.

FIG. 1 illustrates a system including a semiconductor memory device in accordance an embodiment.

Referring to FIG. 1, the system may include a controller 100 and a semiconductor memory device 200.

The controller 100 may provide the semiconductor memory device 200 with an external command CMD_e, an external address ADD_e, and an external synchronization signal Synch_s. Data may be transmitted between the controller 100 and the semiconductor memory device 200. The external synchronization signal Synch_s may include a clock signal or a data strobe signal DQS.

The semiconductor memory device 200 may include first to fourth buffers 210, 220, 230, and 240, a driver 250, a sampling timing signal generation circuit 260, a first arrangement circuit 270, a second arrangement circuit 280, and a data storage circuit 290.

The first buffer 210 may buffer the external command CMD_e to output an internal command CMD_i.

The second buffer 220 may buffer the external address ADD_e to output an internal address ADD_i.

The third buffer 230 may buffer the external synchronization signal Synchs to output an internal synchronization signal S_si.

The fourth buffer 240 may buffer the data from the controller 100. The fourth buffer 240 may provide the first arrangement circuit 270 with the buffered data.

The driver 250 may drive an output signal from the second arrangement circuit 280. The drive 250 may provide the controller 100 with the driven output signal as the data.

The sampling timing signal generation circuit 260 may generate first to fourth sampling timing signals S_ts1, S_ts2, S_ts3, and S_ts4 in response to the internal synchronization signal S_si of the third buffer 230. The sampling timing signals S_ts1, S_ts2, S_ts3, and S_ts4 may be different from one another. In one embodiment, the first to fourth sampling timing signals S_ts1, S_ts2, S_ts3, and S_ts4 may have a phase difference of about 900. For example, the phase difference between the first sampling timing signal S_ts1 and the second sampling timing signal S_ts2 may be about 900. The phase difference between the second sampling timing signal S_ts2 and the third sampling timing signal S_ts3 may be about 90°. The phase difference between the third sampling timing signal S_ts3 and the fourth sampling timing signal S_ts4 may be about 900. The phase difference between the fourth sampling timing signal S_ts4 and the first sampling timing signal S_ts1 may be about 900.

The first arrangement circuit 270 may sample an output signal from the fourth buffer 240 in response to the first to fourth sampling timing signals S_ts1, S_ts2, S_ts3, and S_ts4. The first arrangement circuit 270 may transmit the sampled signal as memory input data D_in to the data storage circuit 290. For example, the first arrangement circuit 270 may sample the output signal from the fourth buffer 240 at a rising timing of the first to fourth sampling timing signals S_ts1, S_ts2, S_ts3, and S_ts4 to generate the input data D_in. The first arrangement circuit 270 may transmit the sampled input data D_in as parallel data to the data storage circuit 290. The first arrangement circuit 270 may include a serial-parallel conversion circuit.

The second arrangement circuit 280 may sample an output signal from the data storage circuit 290, i.e., memory output data D_out in response to the first to fourth sampling timing signals S_ts1, S_ts2, S_ts3, and S_ts4 to generate arrangement data D_s. The second arrangement circuit 280 may transmit the arrangement data to the driver 250. For example, the second arrangement circuit 280 may sample the memory output data D_out in a parallel pattern at a rising timing of the first to fourth sampling timing signals S_ts1, S_ts2, S_ts3, and S_ts4 to generate the arrangement data D_s. The second arrangement circuit 280 may convert the parallel memory output data D_out into serial memory output data. The second arrangement circuit 280 may provide the driver 250 with the serial memory output data.

The data storage circuit 290 may designate storage positions of the memory input data D_in in response to the internal command CMD_i and the internal address ADD_i. The data storage circuit 290 may store the memory input data D_in in the designated positions. The data storage circuit 290 may output the stored data in the designated positions as the memory output data D_out in response to the internal command CMD_i and the internal address ADD_i.

Figure 2:
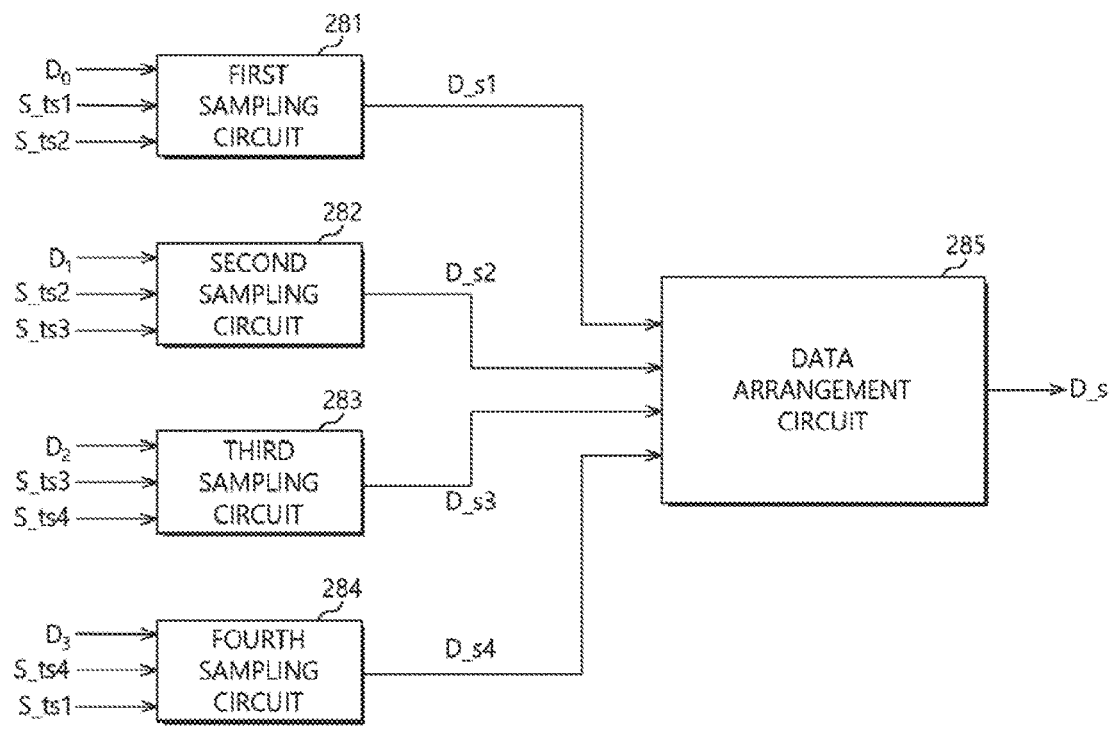
FIG. 2 illustrates a second data arrangement circuit of the semiconductor memory device of FIG. 1.

FIG. 2 illustrates a second data arrangement circuit of the semiconductor memory device in FIG. 1.

Referring to FIG. 2, the second arrangement circuit 280 may include first to fourth sampling circuits 281, 282, 283, and 284 and a data arrangement circuit 285. The memory output data D_out may include parallel type first to fourth memory output data D0, D1, D2, and D3.

The first sampling circuit 281 may sample the first memory output data D0 in response to the first and second sampling timing signals S_ts1 and S_ts2. The first sampling circuit 281 may output a first sampling data D_s1. For example, the first sampling circuit 281 may output the first memory output data D0 as the first sampling data D_s1 overlapped with an interval between the rising timing of the first sampling timing signal S_ts1 and the rising timing of the second sampling timing signal S_ts2.

The second sampling circuit 282 may sample the second memory output data D1 in response to the second and third sampling timing signals S_ts2 and S_ts3. The second sampling circuit 282 may output a second sampling data D_s2. For example, the second sampling circuit 282 may output the second memory output data D1 as the second sampling data D_s2 overlapped with an interval between the rising timing of the second sampling timing signal S_ts2 and the rising timing of the third sampling timing signal S_ts3.

The third sampling circuit 283 may sample the third memory output data D2 in response to the third and fourth sampling timing signals S_ts3 and S_ts4. The third sampling circuit 283 may output a third sampling data D_s3. For example, the third sampling circuit 283 may output the third memory output data D2 as the third sampling data D_s3 overlapped with an interval between the rising timing of the third sampling timing signal S_ts3 and the rising timing of the fourth sampling timing signal S_ts4.

The fourth sampling circuit 284 may sample the fourth memory output data D3 in response to the fourth and first sampling timing signals S_ts4 and S_ts1. The fourth sampling circuit 284 may output a fourth sampling data D_s4. For example, the fourth sampling circuit 284 may output the fourth memory output data D3 as the fourth sampling data D_s4 overlapped with an interval between the rising timing of the fourth sampling timing signal S_ts4 and the rising timing of the first sampling timing signal S_ts1.

The data arrangement circuit 285 may arrange the first to fourth sampling data D_s1, D_s2, D_s3, and D_s4 to output serial arrangement data D_s. The data arrangement circuit 285 may include a parallel-serial data conversion circuit.

The first to fourth sampling circuits 281, 282, 283, and 284 may have substantially the same configuration as one another except for input signals. Thus, hereinafter, only the configuration of the first sampling circuit 281 is illustrated for brevity.

Figure 3:
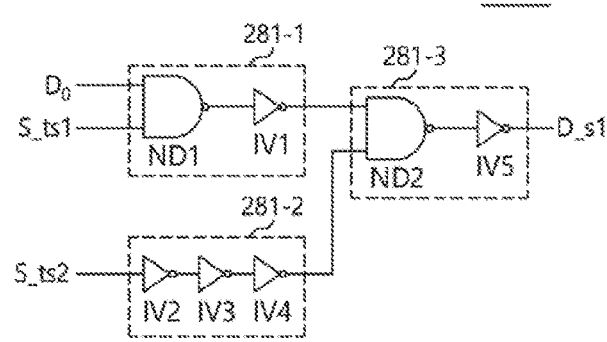
FIG. 3 illustrates a first sampling circuit of the semiconductor memory device of FIG. 2.
Figure 3:
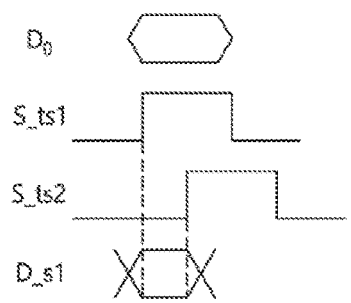

FIG. 3 illustrates the first sampling circuit 281 of the semiconductor memory device of FIG. 2.

Referring to FIG. 3, the first sampling circuit 281 may include a first timing determination circuit 281-1, a second timing determination circuit 281-2, and a sampling data output circuit 281-3.

When the first sampling timing signal S_ts1 may rise, the first timing determination circuit 281-1 may output the first memory output data D0 as the first sampling data D_s1 during a high level interval of the first sampling timing signal S_ts1. A high level and a low level, as used herein with respect to signals, refer to logic levels of the signals. A signal having a low level distinguishes from the signal when it has a high level. For example, the high level may correspond to the signal having a first voltage, and the low level may correspond to the signal having a second voltage. For some embodiments, the first voltage is greater than the second voltage. In other embodiments, different characteristics of a signal, such as frequency or amplitude, determine whether the signal has a high level or a low level. For some cases, the high and low levels of a signal represent logical binary states.

The first timing determination circuit 281-1 may perform a NAND operation and an inversion operation. For example, the first timing determination circuit 281-1 may include a first NAND gate ND1 and a first inverter IV1. The first NAND gate ND1 may receive the first memory output data D0 and the first sampling timing signal S_ts1. The first inverter IV1 may receive an output signal from the first NAND gate ND1.

The second timing determination circuit 281-2 may invert and output the second sampling timing signal S_ts2.

The second timing determination circuit 281-2 may perform an inversion operation. For example, the second timing determination circuit 281-2 may include second to fourth inverters IV2, IV3, and IV4. The second inverter IV2 may receive the second sampling timing signal S_ts2. The third inverter IV3 may receive an output signal from the second inverter IV2. The fourth inverter IV4 may receive an output signal from the third inverter IV3. An element delay time of the second to fourth inverters IV2, IV3, and IV4 may be substantially the same as an element delay time of the first NAND gate ND1 and the first inverter IV1 in the first timing determination circuit 281-1. Alternatively, the element delay time of the second to fourth inverters IV2, IV3, and IV4 may be different from the element delay time of the first NAND gate ND1 and the first inverter IV1 in the first timing determination circuit 281-1.

The sampling data output circuit 281-3 may generate and output the first sampling data D_s1 in response to the output signals from the first and second timing determination circuits 281-1 and 281-2. For example, during a time when the output signal of the second timing determination circuit 281-2 transitions to a low level, that is, when the second sampling timing signal S_ts2 transitions to a high level, the sampling data output circuit 281-3 may output the output signal from the first timing determination circuit 281-1 as the first sampling data D_s1.

The sampling data output circuit 281-3 may perform a NAND operation and an inversion operation. For example, the sampling data output circuit 281-3 may include a second NAND gate ND2 and a fifth inverter IV5. The second NAND gate ND2 may receive the output signals from the first and second timing determination circuits 281-1 and 281-2. The fifth inverter IV5 may receive an output signal from the second NAND gate ND2 and output the first sampling data D_s1.

Referring again to FIG. 2, the first sampling circuit 281 may output the first memory output data D0 as the first sampling data D_s1 overlapped with the interval between the rising timing of the first sampling timing signal S_ts1 and the rising timing of the second sampling timing signal S_ts2. Thus, because the first sampling data D_s1 may be generated between the rising timings of the first and second sampling timing signals S_ts1 and S_ts2 having different phases by about 900, the first sampling data D_s1 may have a unit interval size of data.

Figure 4:
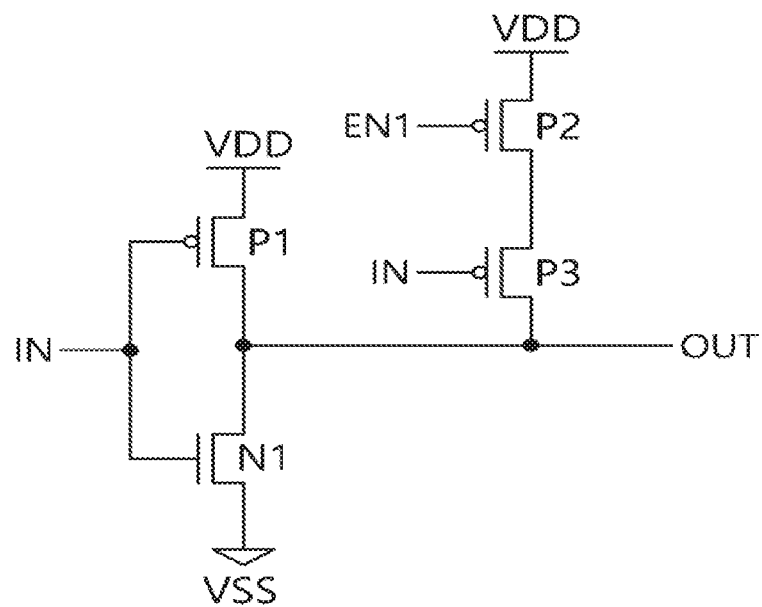
FIGS. 4 and 5 illustrate an inverter of the first sampling circuit of FIG. 3.
Figure 5:
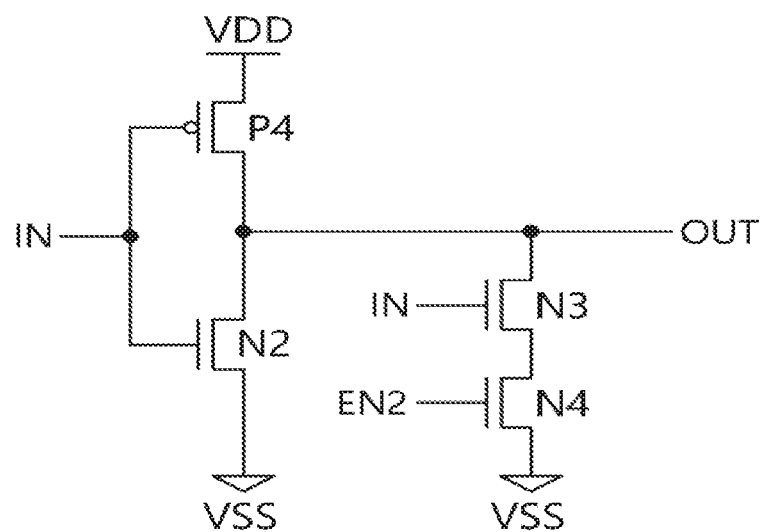

FIGS. 4 and 5 illustrate inverters of the first sampling circuit of FIG. 3.

Referring to FIG. 4, the first timing determination circuit 281-1 may determine a first edge timing of the first sampling data D_s1. The first inverter IV1 of the first timing determination circuit 281-1 may include first, second, third, and fourth transistors P1, N1, P2, and P3.

A gate of the first transistor P1 may receive an input signal IN. A source of the first transistor P1 may receive an external voltage VDD. A gate of the second transistor N1 may receive the input signal IN. A drain of the second transistor N1 may be connected with a drain of the first transistor P1. A source of the second transistor N1 may be connected with a ground terminal VSS. A gate of the third transistor P2 may receive a first enable signal EN1. A source of the third transistor P2 may receive the external voltage VDD. A gate of the fourth transistor P3 may receive the input signal IN. A source of the fourth transistor P3 may be connected with a drain of the third transistor P2. A drain of the fourth transistor P3 may be connected with the first and second transistors P1 and N1. A node connected with the first and second transistors P1 and N1 may output an output signal OUT.

When the input signal having a low level is inputted, the first inverter IV1 may output the output signal OUT having a high level. The first inverter IV1 may increase a slope of a rising edge, i.e., a timing for a transition from a low level to a high level for the output signal OUT when the first enable signal EN1 is enabled to a low level as compared to when the first enable signal EN1 is at a high level. Thus, as shown in FIG. 4, when the first inverter IV1 is used in the first timing determination circuit 281-1, the slope of the rising edge of the first timing determination circuit 281-1 may be determined by the first enable signal EN1.

Referring to FIG. 5, the second timing determination circuit 281-2 may determine a second edge timing of the first sampling data D_s1. Each of the second to fourth inverters IV2, IV3, and IV4 of the second timing determination circuit 281-2 may include fifth, sixth, seventh, and eighth transistors P4, N2, N3, and N4.

A gate of the fifth transistor P4 may receive an input signal IN. A source of the fifth transistor P4 may receive an external voltage VDD. A gate of the sixth transistor N2 may receive the input signal IN. A drain of the sixth transistor N2 may be connected with a drain of the fifth transistor P4. A source of the sixth transistor N2 may be connected with a ground terminal VSS. A gate of the seventh transistor N3 may receive a second enable signal EN2. A drain of the seventh transistor N3 may be connected to a node connected between the fifth and sixth transistors P4 and N2. A gate of the eighth transistor N4 may receive the input signal IN. A drain of the eighth transistor N4 may be connected with a source of the seventh transistor N3. A source of the eighth transistor N4 may be connected with the ground terminal VSS. A node connected with the fifth and sixth transistors P4 and N2 may output an output signal OUT.

When the input signal having a high level is inputted, each of the second to fourth inverters IV2, IV3, and IV4 may output the output signal OUT having a low level. Each of the second to fourth inverters IV2, IV3, and IV4 may increase a slope of a falling edge, i.e., a timing for a transition from a high level to a low level for the output signal OUT when the second enable signal EN2 is enabled to a high level as compared to when the second enable signal EN2 is at a low level. Thus, as shown in FIG. 5, when the second to fourth inverters IV2, IV3, and IV4 are used in the second timing determination circuit 281-2, the slope of the falling edge of the second timing determination circuit 281-2 may be determined by the second enable signal EN2.

When the slope of the rising edge or the falling edge is increased by the inverters in FIGS. 4 and 5, an effective data interval of the sampling data may become wider.

Hereinafter, operations of the sampling circuit are described with reference to FIG. 3.

The sampling circuit 281 may output the first memory output data D0 as the first sampling data D_s1 overlapped with the interval between the rising edges of the first and second sampling timing signals S_ts1 and S_ts2. That is, the sampling circuit 281 may output the first sampling data D_s1 from the rising point (first timing) of the first sampling timing signal S_ts1 to the rising point (second timing) of the second sampling timing signal S_ts2.

Particularly, the sampling circuit 281 may include the first timing determination circuit 281-1, the second timing determination circuit 281-2, and the sampling data output circuit 281-3.

The first timing determination circuit 281-1 may output the first memory output data D0 as a first output signal S_1 during the rising timing of the first sampling timing signal S_ts1, i.e., during a high level interval.

The second timing determination circuit 281-2 may invert the second sampling timing signal S_ts2 to output a second output signal S_2.

The sampling data output circuit 281-3 may output the first output signal S_1 of the first timing determination circuit 281-1 as the first sampling data D_s1 until the second output signal S_2 of the second timing determination circuit 281-2 reaches a low level. That is, the sampling data output circuit 281-3 may output the first output signal S_1 of the first timing determination circuit 281-1 as the first sampling data D_s1 until the second sampling timing signal S_ts2 rises, i.e., transitions to a high level. Thus, the effective data interval of the first sampling data D_s1 may be determined by the first and second sampling timing signals S_ts1 and S_ts2. The first timing determination circuit 281-1 driven in response to the first sampling timing signal S_ts1 and the first memory output data D0 may determine an initial point of the effective data interval (first timing) of the first sampling data D_s1. Because the sampling data output circuit 281-3 may output the first output signal S_1 of the first timing determination circuit 281-1 as the first sampling data D_s1 until the second output signal S_2 of the second timing determination circuit 281-2 reaches the low level, the second timing determination circuit 281-2 driven in response to the second sampling timing signal S_ts2 may determine an ending point of the effective data interval (second timing) of the first sampling data D_s1.

Therefore, the sampling circuit 281 may generate the first sampling data D_s1 having a size substantially the same as the phase difference between the first and second sampling timing signals S_ts1 and S_ts2. Because the phase difference between the first and second sampling timing signals S_ts1 and S_ts2 may be about 90°, a size of the effective interval of the first sampling data D_s1 may be substantially the same as the phase difference of about 90° between the first and second sampling timing signals S_ts1 and S_ts2. Alternatively, in other embodiments, the phase difference between the first and second sampling timing signals S_ts1 and S_ts2 may be other angles different from 90.

According to example embodiments, a sampling circuit may generate and output data having a size substantially the same as a phase difference between the sampling timing signals.

Hereinafter, characteristics of the semiconductor memory device 200 including the sampling circuit 281 are described with reference to FIGS. 1 and 2.

Referring to FIGS. 1 and 2, the semiconductor memory device 200 may include the first to fourth buffers 210, 220, 230, and 240, the driver 250, the sampling timing signal generation circuit 260, the first and second arrangement circuits 270 and 280, and the data storage circuit 290.

The first buffer 210 may buffer the external command CMD_e from the controller 100 to generate the internal command CMD_i.

The second buffer 220 may buffer the external address ADD_e from the controller 100 to generate the internal address ADD_i.

The third buffer 230 may buffer the external synchronization signal Synch_s from the controller 100 to generate the internal synchronization signal S_si. The external synchronization signal Synch_s may include the clock signal, the data strobe signal, etc.

The fourth buffer 240 may buffer the data from the controller 100. The fourth buffer 240 may transmit the data to the first arrangement circuit 270.

The driver 250 may drive the signals from the second arrangement circuit 280. The driver 250 may transmit the driven data to the controller 100.

The sampling timing signal generation circuit 260 may generate the first to fourth sampling timing signals S_ts1, S_ts2, S_ts3, and S_ts4 having the different phases in response to the internal synchronization signal S_si.

The first arrangement circuit 270 may arrange the signal from the fourth buffer 240 in response to the first to fourth sampling timing signals S_ts1, S_ts2, S_ts3, and S_ts4. The first arrangement circuit 270 may provide the data storage circuit 290 with the arranged signals as the input data D_in.

The second arrangement circuit 280 may arrange the memory output data D_out from the data storage circuit 290 in response to the first to fourth sampling timing signals S_ts1, S_ts2, S_ts3, and S_ts4. The second arrangement circuit 280 may provide the driver 250 with the arranged signals.

As shown in FIG. 2, the second arrangement circuit 280 may include the first to fourth sampling circuits 281, 282, 283, and 284 and the data arrangement circuit 285. As shown in FIG. 3, each of the first to fourth sampling circuits 281, 282, 283, and 284 may generate and output the data having the size substantially the same as the phase difference between the sampling timing signals.

According to presented embodiments, a semiconductor memory device may include simple-structured sampling circuits used for outputting data to a controller so that the area efficiency of the semiconductor memory device may be improved.

The above described embodiments of the present teachings are intended to be illustrative and not limiting. Various alternate and equivalent embodiments are also possible. The present teachings are not limited by the embodiments described herein. Nor are the present teachings limited to any specific type of semiconductor device. Other additions, subtractions, or modifications are possible in view of the present disclosure and are intended to fall within the scope of the appended claims.

What is claimed is:

1. A sampling circuit comprising:
a first timing determination circuit for determining a first timing of sampling data in response to a first sampling timing signal;
a second timing determination circuit for determining a second timing of the sampling data in response to a second sampling timing signal; and
a sampling data output circuit for outputting the sampling data having effective data values of the sampling data between the first timing and the second timing in response to output signals from the first and second timing determination circuits,
wherein the first timing determination circuit outputs data at a rising timing of the first sampling timing signal.

2. The sampling circuit of claim 1, wherein there is a phase difference between the first and second sampling timing signals.

3. The sampling circuit of claim 2, wherein the phase difference between the first and second sampling timing signals is substantially ninety degrees (90°).

4. The sampling circuit of claim 2, wherein the first and second sampling timing signals comprise at least one of a clock signal and a data strobe signal.

5. The sampling circuit of claim 1, wherein the second timing determination circuit inverts and outputs the second sampling timing signal.

6. The sampling circuit of claim 1, wherein the sampling data output circuit outputs an output signal from the first timing determination circuit as the sampling data until an output signal from the second timing determination circuit falls.

7. A sampling circuit for outputting data as sampling data during an interval between a rising timing of a first sampling timing signal and a rising timing of a second sampling timing signal, wherein the sampling circuit comprises:

a first timing determination circuit for outputting the data at a rising timing of the first sampling timing signal;

a second timing determination circuit for inverting and outputting the second sampling timing signal; and a sampling data output circuit for outputting an output signal from the first timing determination circuit as the sampling data until an output signal from the second timing determination circuit falls.

8. A semiconductor memory device comprising:

a plurality of sampling circuits for outputting memory output data as sampling data in response to rising timings of at least two different sampling timing signals; and a data arrangement circuit for arranging the sampling data and for outputting arrangement data, wherein each of the sampling circuits comprises:

a first timing determination circuit for receiving a first sampling timing signal of the sampling timing signals and the memory output data;

a second timing determination circuit for inverting and outputting a second sampling timing signal of the sampling timing signals; and a sampling data output circuit for outputting the sampling data in response to output signals from the first and second timing determination circuits.

9. The semiconductor memory device of claim 8, wherein the memory output data correspond to parallel data and the arrangement data correspond to serial data.

10. The semiconductor memory device of claim 8, wherein each of the sampling circuits outputs the memory output data as the sampling data during an interval corresponding to a phase difference between the sampling timing signals.

11. The semiconductor memory device of claim 10, wherein each of the sampling circuits outputs the memory output data as the sampling data during an interval between rising timings of the sampling timing signals.

12. The semiconductor memory device of claim 8, wherein each of the first and second timing determination circuits comprise at least one inverter.

13. The semiconductor memory device of claim 12, wherein the inverter of the first timing determination circuit controls a rising edge slope of the output signal from the first timing determination circuit in response to an enable signal.

14. The semiconductor memory device of claim 12, wherein the inverter of the second timing determination circuit controls a falling edge slope of the output signal from the second timing determination circuit in response to an enable signal.

* * * * *